US006850122B2

(12) United States Patent
Ravi et al.

(10) Patent No.: US 6,850,122 B2
(45) Date of Patent: Feb. 1, 2005

(54) QUADRATURE OSCILLATOR AND METHODS THEREOF

(75) Inventors: Ashoke Ravi, Hillsboro, OR (US); Krishnamurthy Soumyanath, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 55 days.

(21) Appl. No.: 10/401,024

(22) Filed: Mar. 28, 2003

(65) Prior Publication Data

US 2004/0189404 A1 Sep. 30, 2004

(51) Int. Cl.[7] .............................................. H03B 25/00
(52) U.S. Cl. .............................. 331/46; 331/47; 331/48; 331/50; 331/55; 331/117 FE
(58) Field of Search .............................. 331/46, 47, 48, 331/50, 55, 117 FE

(56) References Cited

U.S. PATENT DOCUMENTS 6,175,285 B1 * 1/2001 Gabara .................... 331/117 R

OTHER PUBLICATIONS

A. Ravl et al., "An Integrated 10/5GHz Injection–locked Quadrature LC VCO in a 0.18μm Digital CMOS Process", European Solid State Research Conference (ESSCIRC), Sep. 26, 2002, pp. 1–4.

* cited by examiner

Primary Examiner—Michael B. Shingleton
(74) Attorney, Agent, or Firm—Eitan, Pearl, Latzer & Cohen Zedek, LLP

(57) ABSTRACT

A quadrature oscillator includes a master tuned oscillator and two injection-locked slave tuned oscillators.

19 Claims, 11 Drawing Sheets

QUADRATURE OSCILLATOR AND METHODS THEREOF

BACKGROUND OF THE INVENTION

Radio frequency (RF) transceivers may use quadrature modulation for higher spectral efficiency. The quadrature signals that are used for modulation and demodulation directly affect the performance of the transceiver and thus it is desirable that the quadrature signals be precise and have a low phase noise. Consequently, these signals may be generated locally at the transceiver.

In some conventional transceivers, an oscillator is used to produce an initial frequency at four times the desired frequency of the quadrature signals. The initial frequency is then divided down using at least two stages of digital dividers.

It is well known that generating a high frequency signal may be difficult due to device parasitic capacitances and inductances in the process. This, and the fact the in some conventional transceivers, the source oscillator oscillates at a frequency four times higher than the desired frequency of the quadrature signals, currently limit the quadrature signal frequencies that can be generated. High frequency signals also tend to have a high phase noise.

It is also known that digital dividers are high bandwidth devices, and consequently, the quadrature signals at their output may have more phase noise than the original signal before division.

BRIEF DESCRIPTION OF THE DRAWINGS

The subject matter regarded as the invention is particularly pointed out and distinctly claimed in the concluding portion of the specification. The invention, however, both as to organization and method of operation, together with objects, features and advantages thereof, may best be understood by reference to the following detailed description when read with the accompanied drawings in which:

Figure 1:
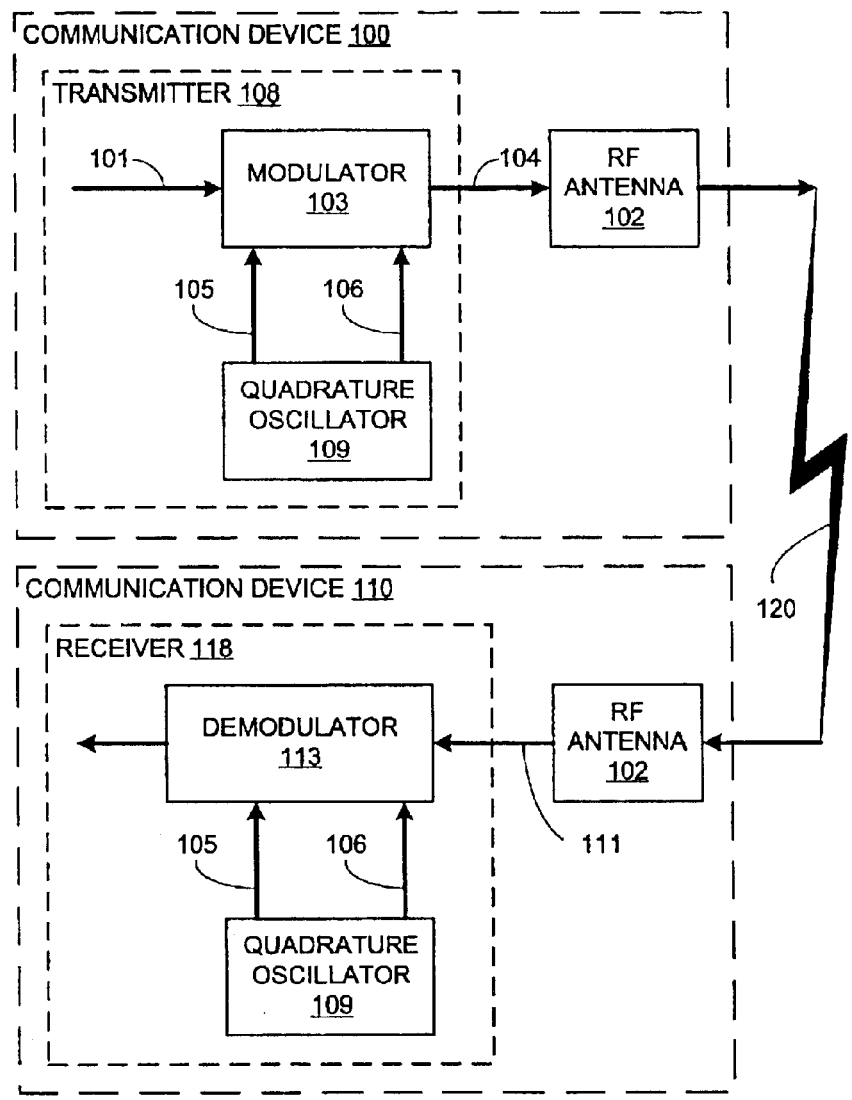
FIG. 1 is a simplified block-diagram illustration of an exemplary communication system, in accordance with some embodiments of the present invention.

It will be appreciated that for simplicity and clarity of illustration, elements shown in the figures have not necessarily been drawn to scale. For example, the dimensions of some of the elements may be exaggerated relative to other elements for clarity. Further, where considered appropriate, reference numerals may be repeated among the figures to indicate corresponding or analogous elements.

DETAILED DESCRIPTION OF THE INVENTION

In the following detailed description, numerous specific details are set forth in order to provide a thorough understanding of the invention. However it will be understood by those of ordinary skill in the art that the present invention may be practiced without these specific details. In other instances, well-known methods, procedures, components and circuits have not been described in detail so as not to obscure the present invention.

It should be understood that the present invention may be used in a variety of applications. Although the present invention is not limited in this respect, the circuit disclosed herein may be used in many apparatuses such as the transmitters and receivers of a radio system. Radio systems intended to be included within the scope of the present invention include, by way of example only, cellular radio telephone communication systems, wireless local area networks that meet the existing 802.11a, b, g, and future high data-rate versions of the above, two-way radio communication systems, one-way pagers, two-way pagers, personal communication systems (PCS) and the like.

Types of cellular radiotelephone communication systems intended to be within the scope of the present invention include, although not limited to, Direct Sequence-Code Division Multiple Access (DS-CDMA) cellular radiotelephone communication systems, Global System for Mobile Communications (GSM) cellular radiotelephone systems, North American Digital Cellular (NADC) cellular radiotelephone systems, Time Division Multiple Access (TDMA) systems, Extended-TDMA (E-TDMA) cellular radiotelephone systems, wideband CDMA (WCDMA), General Packet Radio Service (GPRS) systems, Enhanced Data for GSM Evolution (EDGE) systems, 3.5G and 4G systems.

FIG. 1 is a simplified block-diagram illustration of an exemplary communication system, in accordance with some embodiments of the present invention. A communication device 100 is able to communicate with a communication device 110 over a communication channel 120. It will be appreciated by persons of ordinary skill in the art that a quadrature oscillator according to embodiments of the present invention may be present in communication device 100 only or in communication device 110 only or in both communication devices 100 and 110. The following description is based on the example of both communication devices comprising a quadrature oscillator according to one or another of the embodiments of the present invention, although the present invention is not limited in this respect.

Although the present invention is not limited in this respect, the system shown in FIG. 1 may be part of a cellular communication system, with one of communication devices 100, 110 being a base station and the other a mobile station or with both apparatuses 100, 110 being mobile stations, a pager communication system, a personal digital assistant and a server, etc. Communication devices 100 and 110 may each comprise a radio frequency antenna 102, which may be, for example, a dipole antenna or any other suitable radio frequency antenna.

Communication device 100 may comprise a transmitter 108 that may comprise a modulator 103 and a quadrature oscillator 109. Modulator 103 may modulate and upconvert a data signal 101 using quadrature signals 105 and 106 generated by quadrature oscillator 109 to produce an unconverted modulated data signal 104, which after amplification by a power amplifier (not shown) may then be transmitted by RF antenna 102 over communication channel 120.

Communication device 110 may comprise a receiver 118 that may comprise a demodulator 11 and a quadrature oscillator, referenced 109 to indicate that it may be similar to quadrature oscillator 109 of transmitter 108. Receiver 118 may receive a modulated data signal 111 from communication channel 120 via RF antenna 102, which may be demodulated and downconverted by demodulator 113 using quadrature signals 105 and 106 generated by quadrature oscillator 109.

It will be appreciated by persons of ordinary skill in the art that communication devices 100 and 110, and in particular transmitter 108 and receiver 118, may comprise additional components that are not shown in FIG. 1 so as not to obscure the invention.

Figure 2A:
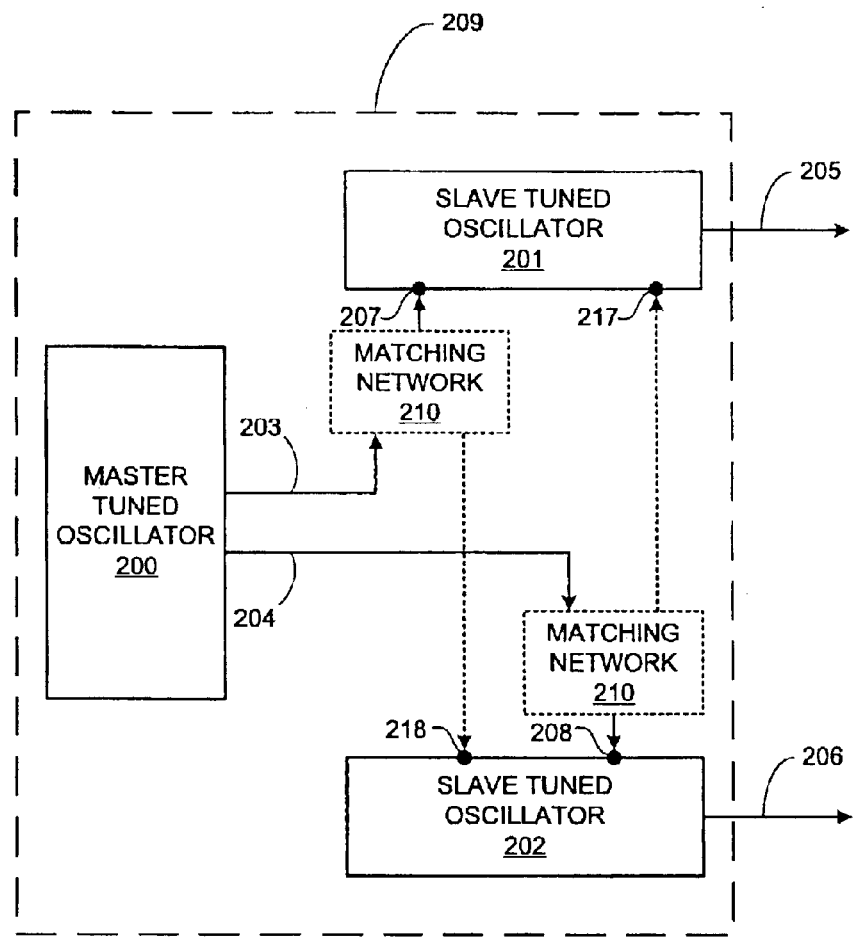
FIG. 2A is a simplified block-diagram illustration of a quadrature oscillator, in accordance with some embodiments of the present invention.

FIG. 2A is a simplified block-diagram illustration of an exemplary quadrature oscillator, in accordance with some embodiments of the present invention. Quadrature oscillator 209 may comprise a master tuned-oscillator 200 and two slave tuned-oscillators 201 and 202.

The master tuned-oscillator 200 may oscillate at its natural self-resonant frequency $f_M$, which may be selectable from a range of frequencies, producing two signals 203 and 204. Both signals may have a frequency $2f_O$ and a phase difference of π radians therebetween.

Slave tuned-oscillators 201 and 202 may have natural self-resonant frequencies $f_{S1}$ and $f_{S2}$, respectively. Slave tuned-oscillator 201 (202) may comprise an input node 207 (208) having the property that when slave tuned-oscillator 201 (202) oscillates a its natural self-resonant frequency, only even harmonics of the natural self-resonant frequency can exist at this input node 207 (208). Slave tuned-oscillator 201 (202) may also comprise an optional input node 217 (218) having the property that when slave tuned-oscillator 201 (202) oscillates at its natural self-resonant frequency, only even harmonics of the natural self-resonant frequency can exist at this input node 217 (218). Moreover, the signal at input node 217 (218) may have a phase difference of π radians from the signal t node 207 (208).

However, if a periodic signal having certain characteristics is injected into input node 207 (208), slave tuned-oscillator 201 (202) and its output signal 205 (206) may oscillate at half of the injected signal's frequency and not at its natural self-resonant frequency $f_{S1}$ ($f_{S2}$). Moreover, output signal 205 (206) may maintain phase relations with the signal injected at 207 (208).

If a periodic signal having certain characteristics is injected into input node 207 (208), and in addition, a periodic signal having similar characteristics and having a phase difference of π radians from the signal at node 207 (208) is injected into input node 217 (218), slave tuned-oscillator 201 (202) and its output signal 205 (206) may oscillate at half of the injection signal's frequency and not at its natural self-resonant frequency $f_{S1}$ ($f_{S2}$). This oscillation may be more immune to noise than the oscillation induced by having an injected signal only at one input node. Moreover, output signal 205 (206) may maintain phase relations with the signal injected at 207 (208). Consequently, a period of the signal at 205 (206) may contain two periods of the signal at 207 (208).

Signal 203, having a frequency of $2f_O$, may be injected into node 207 of slave tuned-oscillator 201 through an optional matching network 210. If slave tuned-oscillator 201 is tuned to have its resonant frequency $f_{S1}$, sufficiently close, for example, within an injection-locking range, to $f_O$, and the amplitude of signal 203 is within an appropriate range, then slave tuned-oscillator 201 may oscillate at half of the frequency of signal 203, namely at $f_O$. Slave tuned-oscillator 201 may then generate output signal 205 at frequency $f_O$ and maintain a phase relation with signal 203. In other words, slave tuned-oscillator 201 is 'locked' to signal 203.

Similarly, signal 204, having a frequency of $2f_O$, may be injected into node 208 of slave tuned-oscillator 202 through optional matching network 210. If slave tuned-oscillator 202 is tuned to have its natural self-resonant frequency $f_{S2}$ sufficiently close, for example, within an injection-locking range, to $f_O$, and the amplitude of signal 204 is within an appropriate range, then slave tuned-oscillator 202 may oscillate at half of the frequency of signal 204, namely at $f_O$. Slave tuned-oscillator 202 may then generate output signal 206 at frequency $f_O$ and maintain a phase relation with signal 204. In other words, slave tuned-oscillator 202 is 'locked' to signal 204.

In addition, signal 203 may be injected into node 218 of slave tuned-oscillator 202 through optional matching network 210, and signal 204 may be injected into node 217 of slave tuned-oscillator 201 through optional matching network 210.

Figure 2B:
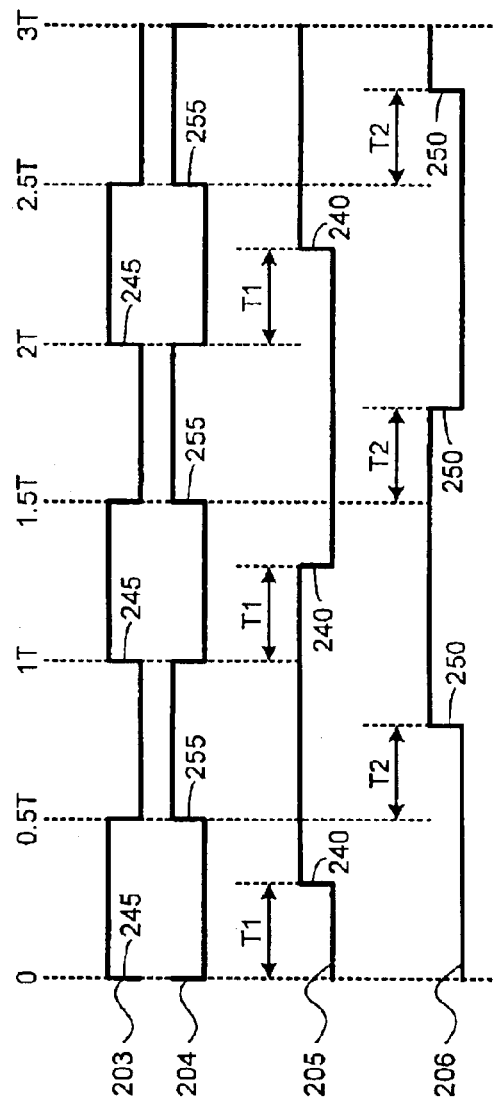
FIG. 2B is a simplified exemplary illustration of waveforms of signals in the quadrature oscillator of FIG. 2A.

Reference is now made briefly to FIG. 2B, which is a simplified exemplary illustration of a waveform of signals 203, 204, 205 and 206 of FIG. 2A, when slave tuned-oscillator 201 is locked to signal 203 and slave tuned-oscillator 202 is locked to signal 204. Signals 203 and 204 may have a period T and may be opposite in direction, reflecting a frequency of $2f_O$ and a phase difference of p radians. Signals 205 and 206 may have a period 2T, reflecting a frequency of $f_O$.

Signal 205 may maintain phase relations with signal 203, having direction changes 240 occurring T1 seconds after low-to-high changes 245 of signal 203. Signal 206 may maintain phase relations with signal 204, having direction changes 250 occurring T2 seconds after low-to-high changes 255 of signal 204. When slave tuned-oscillator 201 is locked to signal 203 and slave tuned-oscillator 202 is locked to signal 204, then T1 equals T2, resulting in phase quadrature, that is, a phase difference of π/2 radians between signals 205 and 206. Since signals 205 and 206 are generated by two tuned circuits that are locked together, the phase noise may be reduced by a factor related to the square of the quality factor of the resonant circuits ("tanks").

In FIGS. 3–10, quadrature oscillators according to various exemplary embodiments of the present invention will now be described. These exemplary quadrature oscillators include exemplary embodiments of master tuned-oscillators and slave tuned-oscillators corresponding to the master tuned-oscillators and slave tuned-oscillators of FIG. 2A.

Figure 9:
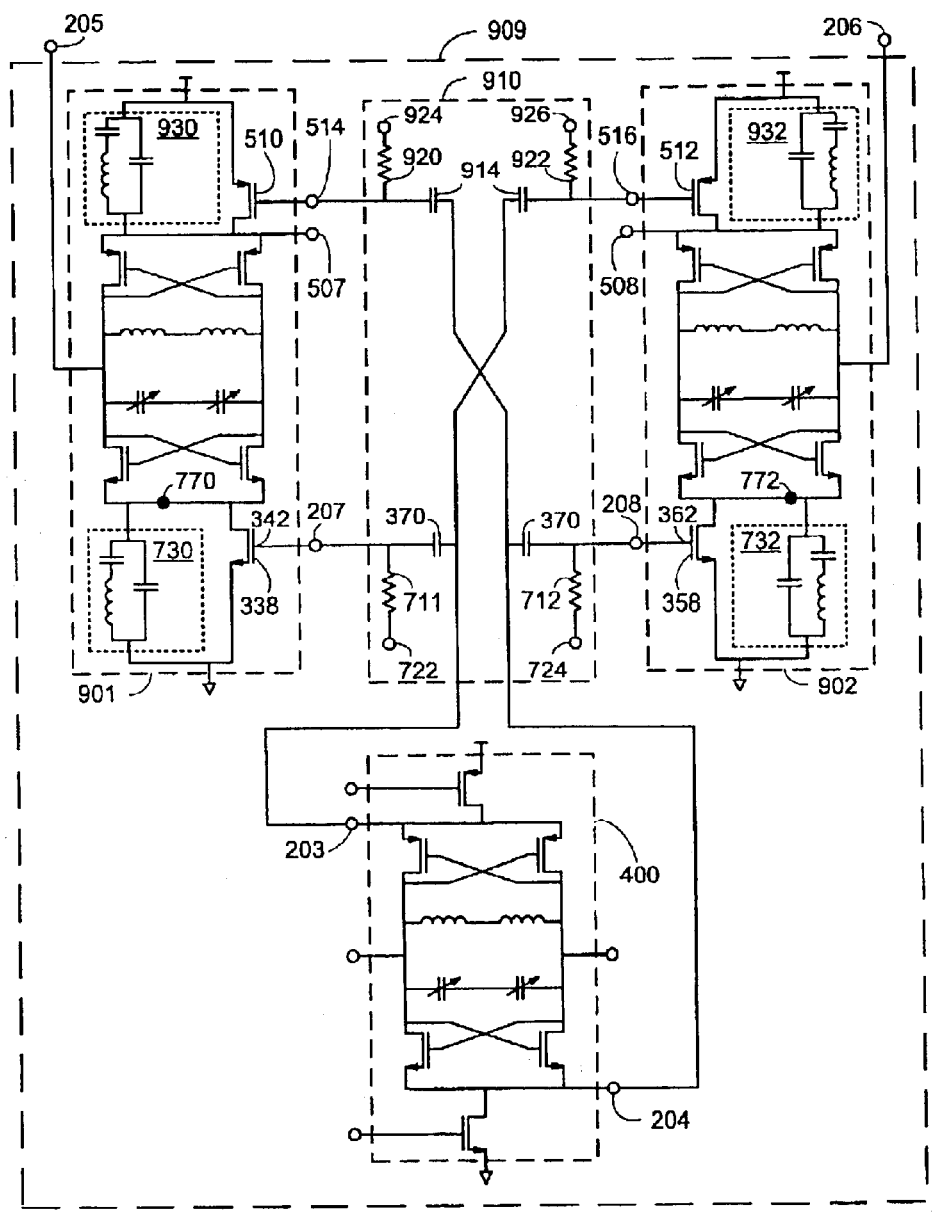
Figure 10:
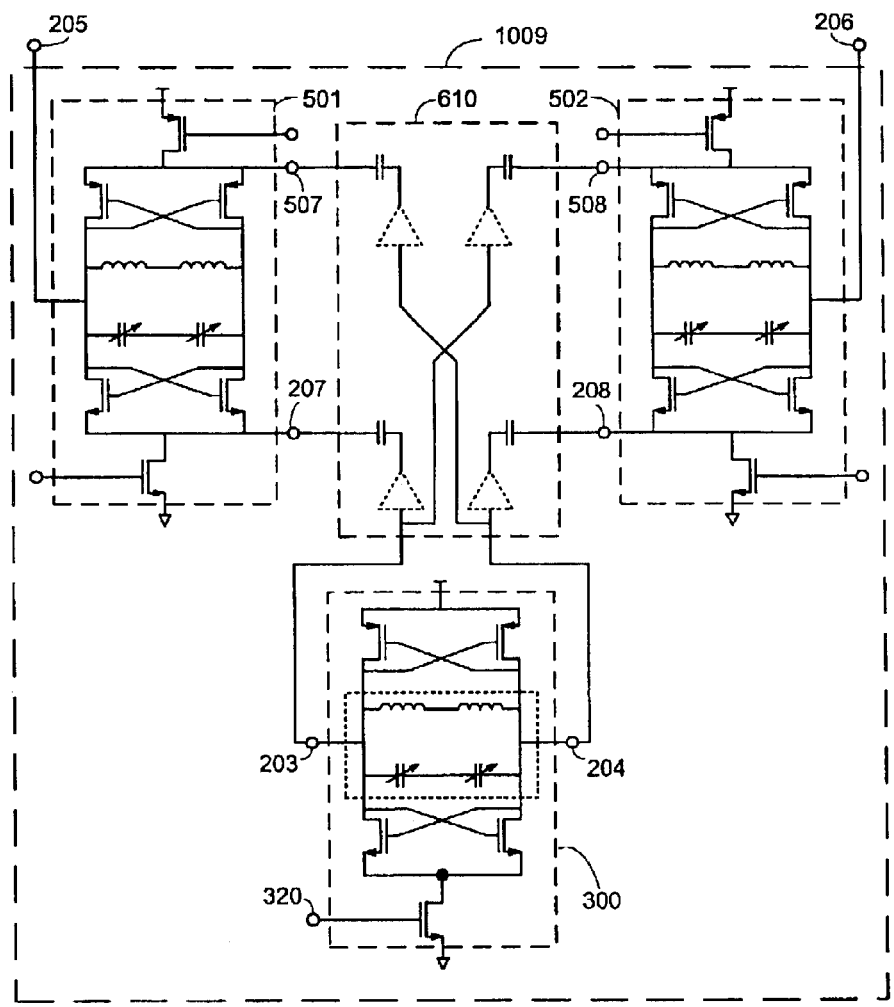

In FIGS. 3, 4, 5, 7, and 8, a master tuned-oscillator is coupled to slave tuned-oscillators with single-ended inputs, possibly using appropriate matching networks. In FIGS. 6, 9, and 10, a master tuned-oscillator is coupled to slave tuned-oscillators with differential inputs.

Figure 3:
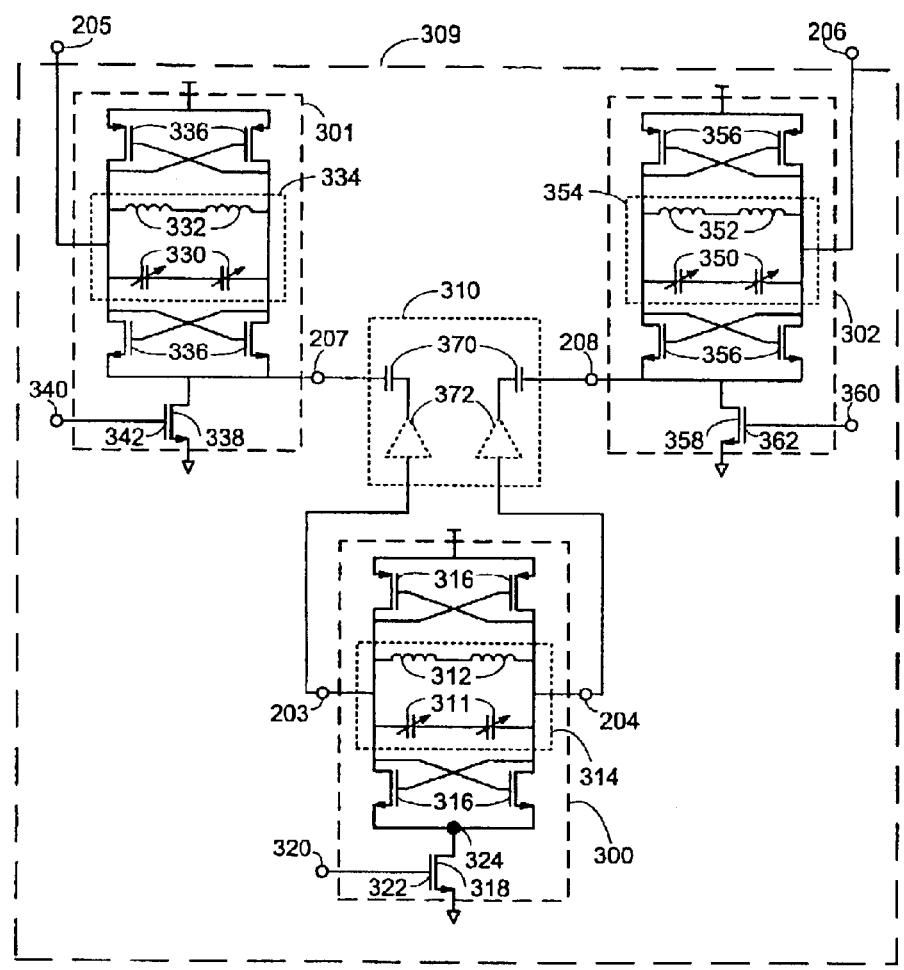
FIGS. 3–10 are schematic illustration of quadrature oscillators, in accordance with various embodiments of the present invention.
Figure 6:
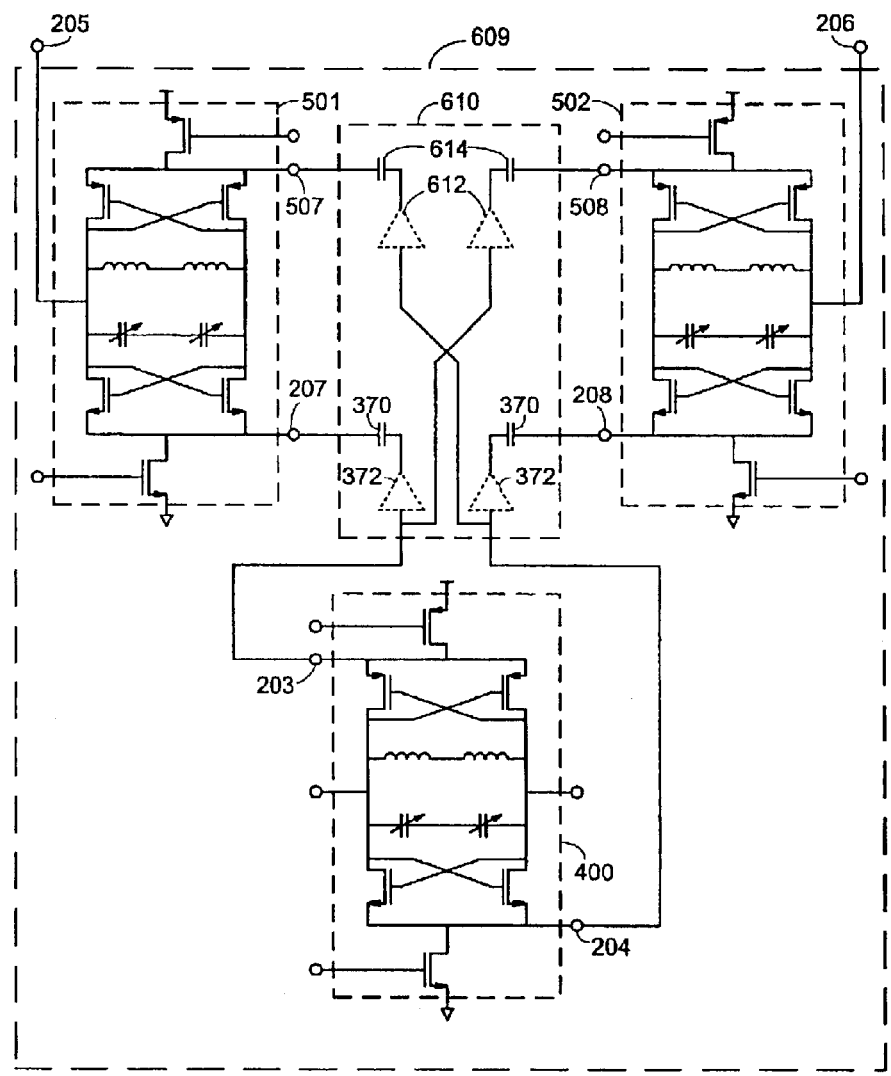
Figure 7:
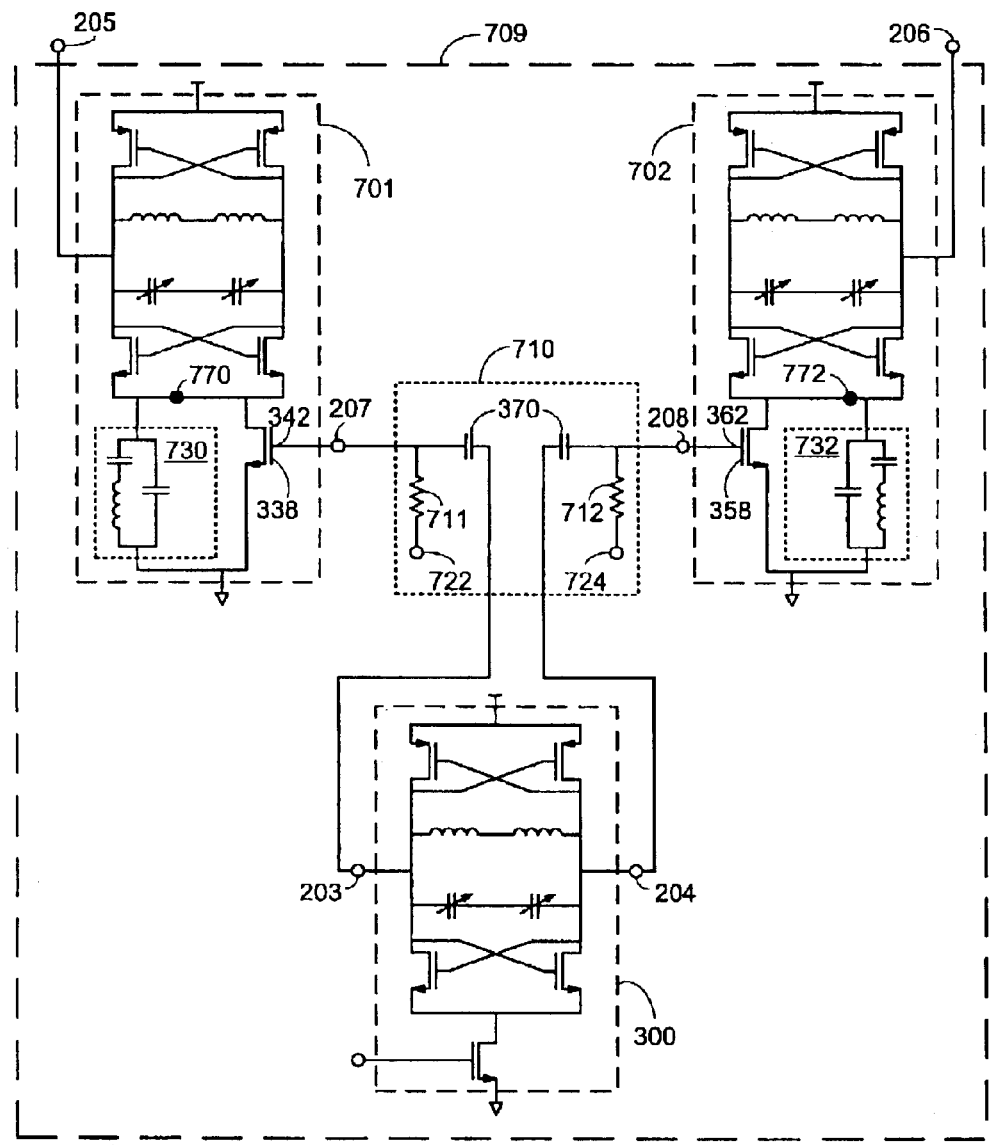

The master tuned-oscillators illustrated in FIGS. 3, 7, and 10 are tuned to oscillate at $2f_O$ in order to generate output signals 203 and 204 oscillating at $2f_O$. In contrast, in FIGS. 4, 5, 6, 8 and 9, since output signals 203 and 204 are generated at second-harmonic nodes, master tuned-oscillator is tuned to oscillate at $f_O$ to produce output signals 203 and 204 oscillating at $2f_O$.

FIG. 3 is a schematic illustration of a quadrature oscillator 309, in accordance with some embodiments of the present invention. Quadrature oscillator 309 may comprise a master tuned-oscillator 300 and slave tuned-oscillators 301 and 302, and may optionally comprise a matching network 310.

Master tuned-oscillator 300 may comprise two pairs of cross-coupled transistors 316, a tank 314, and a transistor 318. Tank 314 may comprise capacitors 311 and inductors 312 connected in parallel. The natural self-resonant frequency $f_M$ of master tuned-oscillator 300 may be determined by the properties of capacitors 311 and inductors 312. Inductors 312 may have a fixed inductance, while capacitors 311 may be variable and controlled for the purpose of tuning the natural self-resonant frequency $f_M$. Cross-coupled transistors 316 may create a negative resistance path to cancel out any losses in tank 314., Transistor 318 may be a tail current source, receiving a biasing signal 320 at its gate 322. A node 324 may have the property that only even harmonics of the natural self-resonant frequency $f_M$ can exist at this node.

Natural self-resonant frequency $f_M$ of master tuned-oscillator 300 may be tuned to be $2f_O$, namely, signals 203 and 204 may be of frequency $2f_O$.

Slave tuned-oscillator 301 (302) may comprise two pairs of cross-coupled transistors 336 (356), a tank 334 (354) and a transistor 338 (358). Tank 334 (354) may comprise capacitors 330 (350) and inductors 332 (352) connected in parallel. The natural self-resonant frequency $f_{S1}$ ($f_{S2}$) of slave tuned-oscillator 301 (302) may be determined by the properties of capacitors 330 (350) and inductors 332 (352). Inductors 332 (352) may have a fixed inductance, while capacitors 330 (350) may be variable and controlled for the purpose of tuning the natural self-resonant frequency $f_{S1}$ ($f_{S2}$). Cross-coupled transistors 336 (356) may create a negative resistance path to cancel out any losses in tank 334 (354). Transistor 338 (358) may be a tail current source receiving a biasing signal 340 (360) at its gate 342 (362). Natural self-resonant frequency $f_{S1}$ ($f_{S2}$) of slave tuned-oscillators 301 (302) may be tuned to be sufficiently close to $f_O$. Moreover, the signal injected at an input node 207 (208) may have the appropriate amplitude, and consequently slave tuned-oscillator 301 (302) may lock to the signal at input node 207 (208).

A single-ended connection scheme, an exemplary embodiment of which is shown by matching network 310, may be used to couple master tuned-oscillator 300 and slave tuned-oscillators 301 and 302. Matching network 310 may couple signal 203 to input node 207 and signal 204 to input node 208. Capacitors 370 of matching network 310 may block the direct current (DC) components and pass the alternate current (AC) components of signals 203 and 204. Although the present invention is not limited in this respect, capacitors 370 may be Metal-Insulator-Metal (MiM) capacitors available as an add-on for Complementary-Metal-Oxide-Semiconductor (CMOS), vertical mesh Metal-Metal capacitors. Matching network 310 may optionally comprise buffers 372 coupled to capacitors 370 to minimize kickback of signals into master tuned-oscillator 300.

Figure 4:
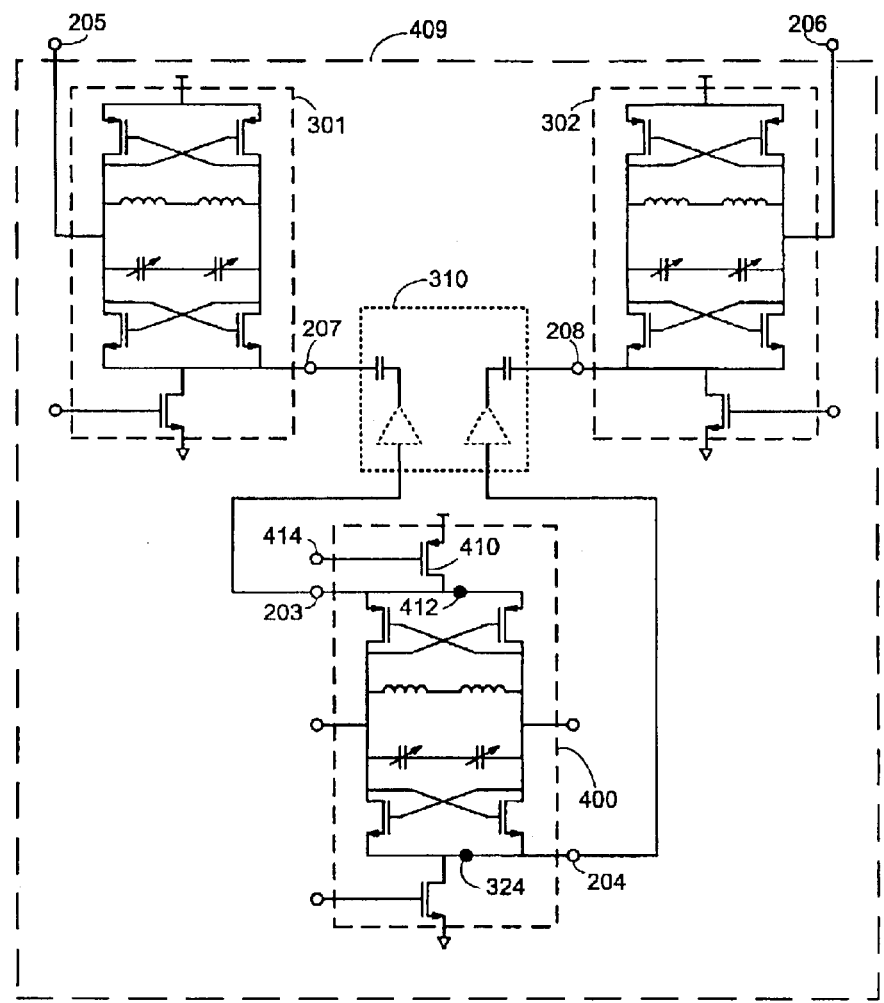

FIG. 4 is a schematic illustration of a quadrature oscillator 409, in accordance with some embodiments of the present invention. Quadrature oscillator 409 may comprise a master tuned-oscillator 400 and slave tuned-oscillators 301 and 302, and may optionally comprise matching network 310.

Master tuned-oscillator 400 is similar to master tuned-oscillator 300, and may have differences as described below.

Master tuned-oscillator 400 may contain a tail current source transistor 410 that may require an additional biasing signal 414 and may create a node 412. As with node 324, node 412 may have the property that only even harmonics of the natural self-resonant frequency $f_M$ can exist at this node. Moreover, the signal at node 412 may have a phase difference of π radians from the signal at node 324.

Provided that master tuned-oscillator 400 is tuned to oscillate at frequency $f_M=f_O$, nodes 324 and 412 may develop the second harmonic of $f_M$, namely $2f_O$, and may oscillate with a phase difference of π radians. Consequently nodes 324 and 412 may be used as sources for signals 204 and 203, respectively.

Figure 5:
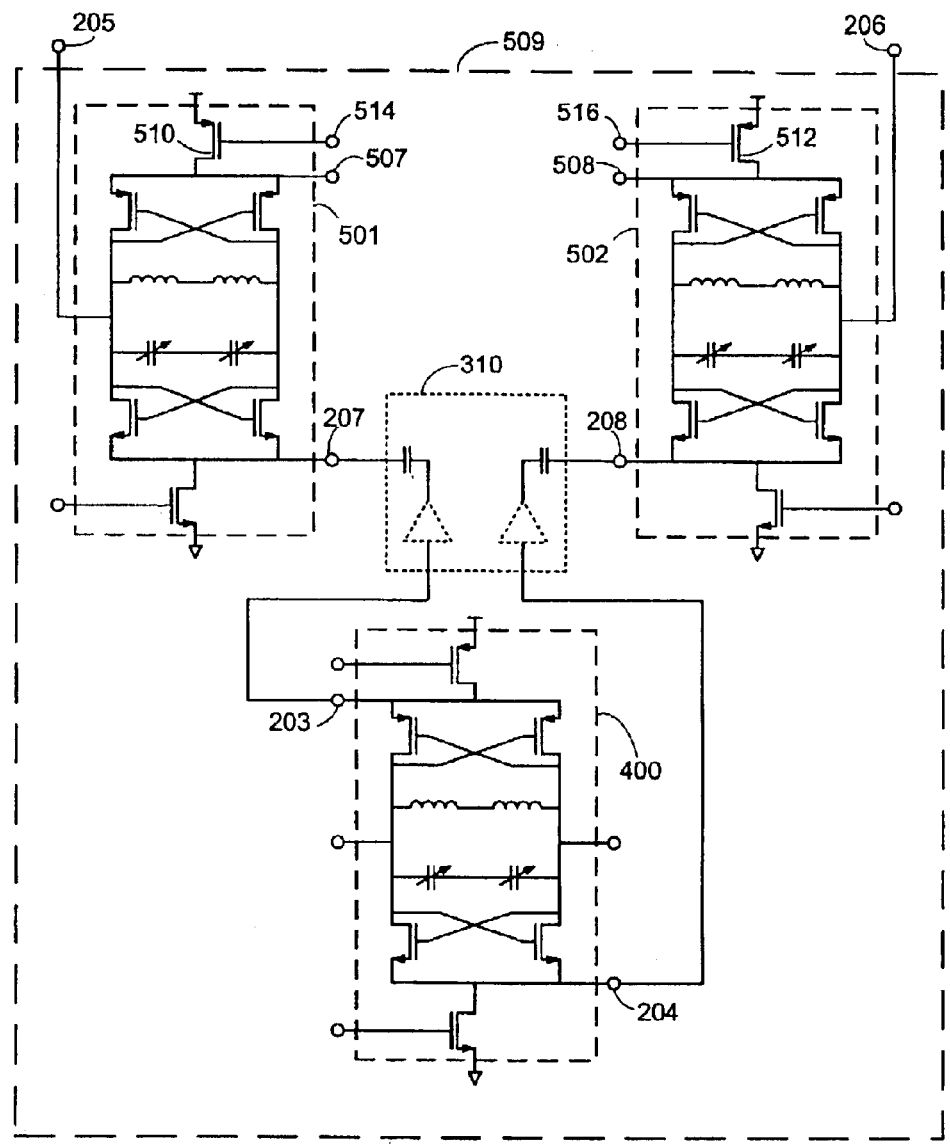

FIG. 5 is a schematic illustration of a quadrature oscillator 509, in accordance with some embodiments of the present invention. Quadrature oscillator 509 may comprise master tuned-oscillator 400 and slave tuned oscillators 501 and 502, and may optionally comprise matching network 310.

Slave tuned oscillators 501 and 502 are similar to slave tuned-oscillators 301 and 302, respectively, and may have differences as described below.

Slave tuned-oscillator 501 (502) may contain a tail current source transistor 510 (512) that may receive a biasing signal at an input node 514 (516) and may create a node 507 (508). Node 507 (508) may have similar properties to those of node 207 (208), namely, if slave tuned-oscillator 501 (502) oscillates in its natural self-resonant frequency $f_{S1}$ ($f_{S2}$), only even harmonics of the natural self-resonant frequency can exist at this node. Moreover, the signal at node 507 (508) may have a phase difference of π radians from the signal at node 207 (208).

When a periodic signal of $2f_O$ frequency and adequate amplitude is injected into node 207 (208), node 507 (508) may oscillate at frequency $2f_O$ and may have a phase that is π radians apart from the injected signal at node 207 (208).

It will be appreciated by persons of ordinary skill in the art that the architecture of slave tuned-oscillators 501 and 502 is similar to that of master tuned-oscillator oscillator 400. Consequently, the total phase noise associated with quadrature oscillator 509 may be reduced relative to that associated with quadrature oscillator 409.

FIG. 6 is a schematic illustration of a quadrature oscillator 609, in accordance with some embodiments of the present invention. Quadrature oscillator 609 may comprise master tuned-oscillator 400 and slave tuned-oscillators 501 and 502, and may optionally comprise a matching network 610.

A differential connection scheme, an exemplary embodiment of which is shown by matching network 610, may be used to couple master tuned-oscillator 400 and slave tuned-oscillators 501 and 502. Matching network 610 may couple signal 203 to input node 207 of slave tuned-oscillator 501 and to input node 508 of slave tuned-oscillator 502, and may also couple signal 204 to input node 208 of slave tuned-oscillator 502 and to input node 507 of slave tuned-oscillator 501.

Matching network 610 may comprise capacitors 370 for input nodes 207 and 208, and capacitors 614 for input nodes 507 and 508. Matching network 610 may also optionally comprise buffers 372 for input nodes 207 and 208, and buffers 612 for input nodes 507 and 508.

When a periodic signal of $2f_O$ frequency and adequate amplitude is injected into node 207 (208), node 507 (508) may oscillate at frequency $2f_O$ and may have a phase that is π radians apart from the injected signal at node 207 (208).

Furthermore, when a periodic signal of $2f_O$ frequency and adequate amplitude is injected into node 507 (508), slave tuned-oscillator 501 (502) and its output signal 205 (206) may oscillate at half of the injection signal's frequency and not at its natural self-resonant frequency $f_{S1}$ ($f_{S2}$), and may maintain phase relations with the signal injected at node 507 (508).

Furthermore, when periodic signals of $2f_O$ frequency, adequate amplitudes and a phase difference of π radians are injected into nodes 207 and 507 (208 and 508), slave tuned-oscillator 501 (502) may oscillate at $f_O$ frequency and maintain phase relations with the injected signals. This behavior is the same, but more immune to noise, than in the case of a signal injected solely into node 207 (208) or 507 (508).

It will be appreciated by persons of ordinary skill in the art that since quadrature oscillator 609 incorporates a differential connection scheme, the total phase noise associated with quadrature oscillator 609 may be less than that of quadrature oscillator 509, which incorporates a single-ended connection scheme.

FIG. 7 is a schematic illustration of a quadrature oscillator 709, in accordance with some embodiments of the present invention. Quadrature oscillator 709 may comprise master tuned-oscillator 300 and slave tuned-oscillators 701 and 702, and may optionally comprise a matching network 710.

Gate 342 (362) of tail current source transistor 338 (358) may be used at tuned oscillator 701 (702) as input node 207 (208). The amplitude of the signal at input node 207 (208) may be smaller than the minimum amplitude required to force slave tuned-oscillator 701 (702) to oscillate at $f_O$. (In this embodiment, the natural self-resonant frequency $f_M$ of master tuned-oscillator 300 may be tuned to be $2f_O$, namely, signals 203 and 204 may be of frequency $2f_O$.) Slave tuned oscillator 701 (702) may therefore optionally comprise a shunt resonant circuit 730 (732), tuned to $2f_O$ frequency. Shunt resonant circuit 730 (732) may be coupled to a node 770 (772), matching the amplitude requirements of slave tuned-oscillator 701 (702) to the amplitude of the signal at input node 207 (208).

A single-ended connection scheme, an exemplary embodiment of which is shown by matching network 710, may be used to couple master tuned-oscillator 300 and slave tuned-oscillators 701 and 702. Matching network 710 comprising capacitors 370 may couple signal 203 to input node 207 and signal 204 to input node 208. In contrast with matching network 310 of FIG. 3, matching network 710 may not comprise buffers 372 since the input impedance of gates 342 and 362 may be high. Matching network 710 may comprise resistors 711 and 712 to inject DC biasing signals 722 and 724 to the gates 342 and 362 of tail current source transistors 338 and 358, respectively.

Figure 8:
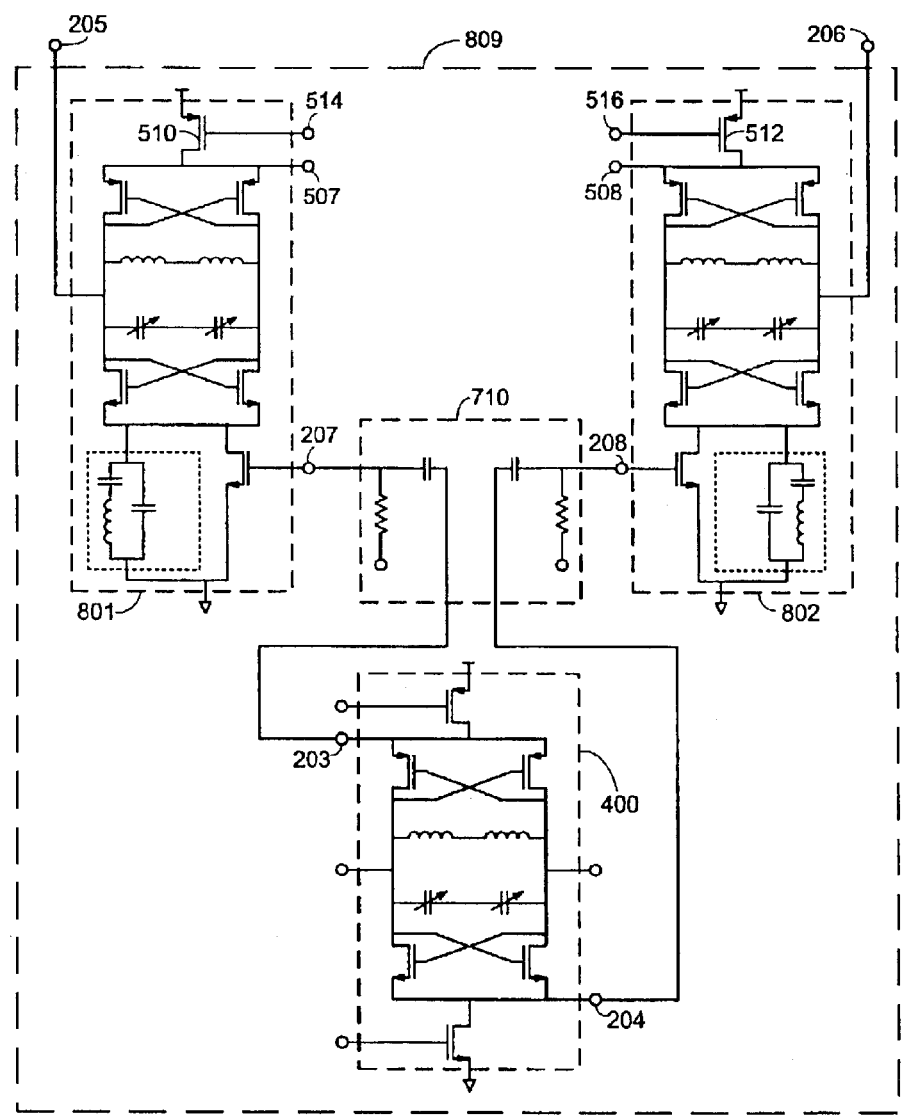

FIG. 8 is a schematic illustration of a quadrature oscillator 809, in accordance with some embodiments of the present invention. Quadrature oscillator 809 may comprise master tuned-oscillator 400 and slave tuned-oscillators 801 and 802, and may optionally comprise matching network 710.

Slave tuned oscillators 801 and 802 are similar to slave tuned-oscillators 701 and 702 of FIG. 7 respectively, and may have differences as described below.

Slave tuned-oscillator 801 (802) may contain tail current source transistor 510 (512) that may require an additional biasing signal at node 514 (516) and may create a node 507 (508).

As in quadrature oscillator 509 of FIG. 5, the architecture of slave tuned-oscillators 801 and 802 is similar to that of master tuned-oscillator 400. Consequently, the total phase noise associated with quadrature oscillator 809 may be reduced.

FIG. 9 is a schematic illustration of a quadrature oscillator 909, in accordance with some embodiments of the present invention. Quadrature oscillator 909 may comprise master tuned-oscillator 400 and slave tuned-oscillators 901 and 902, and may optionally comprise a matching network 910.

Slave tuned oscillators 901 and 902 are similar to slave tuned-oscillators 801 and 802, respectively, and may have differences as described below.

A shunt resonant circuit 930, that may be similar to shunt resonant circuit 730, may be coupled to node 507 of slave tuned-oscillator 901. A shunt resonant circuit 932, that may be similar to shunt resonant circuit 732, may be coupled to node 508 of slave tuned-oscillator 902.

A differential connection scheme, an exemplary embodiment of which is shown by matching network 910, may be used to couple master tuned-oscillator 400 and slave tuned-oscillators 901 and 902. Matching network 910 may couple signal 203 to input node 207 of slave tuned-oscillator 901 and to input node 516 of slave tuned-oscillator 902, and may also couple signal 204 to input node 208 of slave tuned-oscillator 902 and to input node 514 of slave tuned-oscillator 901.

Matching network 910 may comprise capacitors 370 for input nodes 207 and 208, and may also comprise resistors 711 and 712 to couple DC biasing signals 722 and 724 to the gates 342 and 362 of tail current source transistors 338 and 358, respectively. Moreover, matching network 910 may comprise capacitors 914 for input nodes 514 and 516, and may also comprise resistors 920 and 922 to couple DC biasing signals 924 and 926 to the gates of tail comment source transistors 510 and 512, respectively.

It will be appreciated by persons of ordinary skill in the art that since quadrature oscillator 909 incorporates a differential connection scheme, the total phase noise associated with quadrature oscillator 909 may be less than that of quadrature oscillator 809, which incorporates a single-ended connection scheme.

While certain features of the invention have been illustrated and described herein, many modifications, substitutions, changes, and equivalents will now occur to those of ordinary skill in the art. As one non-limiting example of these many modifications and changes, a quadrature oscillator 1009 shown in FIG. 10 may comprise master tuned-oscillator 300 and slave tuned-oscillators 501 and 502, and may optionally comprise matching network 610. It is, therefore, to be understood that the appended claims are intended to cover all such modifications and changes as fall within the true spirit of the invention.

What is claimed is:

1. A method comprising:
    generating quadrature signals from substantially anti-phase output signals of a source oscillator oscillating at a frequency, said output signals having substantially twice said frequency, said quadrature signals having substantially said frequency and having a phase difference therebetween of substantially p/2 radians.

2. The method of claim 1, wherein generating said quadrature signals comprises:
    tuning slave oscillators coupled to said source oscillator to have a natural self-resonant frequency within an injection-locking range to said frequency.

3. The method of claim 1, wherein generating said quadrature signals comprises:
    injecting said output signals to single-ended inputs of tuned slave oscillators.

4. The method of claim 1, wherein generating said quadrature signals comprises:
    injecting said output signals to differential inputs of tuned slave oscillators.

5. An apparatus comprising:
    a quadrature oscillator including at least a source oscillator able to oscillate at a frequency and to produce substantially anti-phase output signals at twice said frequency, said quadrature oscillator able to generate quadrature signals from said output signals, said quadrature signals having substantially said frequency and having a phase difference therebetween of substantially p/2 radians.

6. The apparatus of claim 5, wherein said quadrature oscillator further includes two slave oscillators having input nodes coupled to output nodes of said source oscillator.

7. The apparatus of claim 6, wherein said input nodes are coupled to said output nodes via a single-ended connection scheme.

8. The apparatus of claim 6, wherein said input nodes are coupled to said output nodes via a differential connection scheme.

9. The apparatus of claim 6, wherein the architecture of each of said slave oscillators is similar to the architecture of said source oscillator.

10. The apparatus of claim 6, wherein said slave oscillators are tuned oscillators.

11. The apparatus of claim 6, wherein at least one of said slave oscillators includes at least one shunt resonant circuit tuned to twice said frequency.

12. The apparatus of claim 6, further comprising a matching network coupling said slave oscillators to said source oscillator.

13. The apparatus of claim 5, wherein said source oscillator is a tuned oscillator.

14. A communication device comprising:
   a dipole antenna; and
   a quadrature oscillator including at least a source oscillator able to oscillate at a frequency and to produce substantially anti-phase output signals at twice said frequency, said quadrature oscillator able to generate quadrature signals from said output signals, said quadrature signals having substantially said frequency and having a phase difference therebetween of substantially p/2 radians.

15. The communication device of claim 14, wherein said quadrature oscillator further includes two slave oscillators having input nodes coupled to output nodes of said source oscillator.

16. The communication device of claim 14, wherein said communication device is a base station.

17. A communication system comprising:
   a first communication device; and
   a second communication device able to communicate with said first communication device via a communication channel,
   wherein at least one of said first communication device and said second communication device comprises:
      a quadrature oscillator including at least a source oscillator able to oscillate at a frequency and to produce substantially anti-phase output signals at twice said frequency, said quadrature oscillator able to generate quadrature signals from said output signals, said quadrature signals having substantially said frequency and having a phase difference therebetween of substantially p/2 radians.

18. The communication system of claim 17, wherein said quadrature oscillator further includes two slave oscillators having input nodes coupled to output nodes of said source oscillator.

19. The communication system of claim 18, wherein said quadrature oscillator further comprises a matching network coupling said slave oscillators to said source oscillator.

* * * * *

UNITED STATES PATENT AND TRADEMARK OFFICE
CERTIFICATE OF CORRECTION

PATENT NO. : 6,850,122 B2
DATED : February 1, 2005
INVENTOR(S) : Ravi, Ashoke et al.

It is certified that error appears in the above-identified patent and that said Letters Patent is hereby corrected as shown below:

Column 8,
Lines 42 and 64, please replace "p/2" with -- $\pi/2$ --.

Column 9,
Line 29, please repace "p/2" with -- $\pi/2$ --.

Column 10,
Line 21, please replace "p/2" with -- $\pi/2$ --.

Signed and Sealed this

Seventeenth Day of May, 2005

JON W. DUDAS
*Director of the United States Patent and Trademark Office*